US008829331B2

(12) United States Patent
Gruen

(10) Patent No.: US 8,829,331 B2
(45) Date of Patent: Sep. 9, 2014

(54) APPARATUS PERTAINING TO THE CO-GENERATION CONVERSION OF LIGHT INTO ELECTRICITY

(71) Applicant: Dimerond Technologies, LLC, Downers Grove, IL (US)

(72) Inventor: Dieter M. Gruen, Downers Grove, IL (US)

(73) Assignee: Dimerond Technologies LLC, Downers Grove, IL (US)

( * ) Notice: Subject to any disclaimer, the term of this patent is extended or adjusted under 35 U.S.C. 154(b) by 0 days.

(21) Appl. No.: 13/908,215

(22) Filed: Jun. 3, 2013

(65) Prior Publication Data

US 2014/0041704 A1 Feb. 13, 2014

Related U.S. Application Data

(63) Continuation-in-part of application No. 13/682,229, filed on Nov. 20, 2012, now Pat. No. 8,586,999.

(60) Provisional application No. 61/681,873, filed on Aug. 10, 2012.

(51) Int. Cl.

| | |
|---|---|
| ***H01L 31/042*** | (2014.01) |
| ***H01L 31/0232*** | (2014.01) |
| ***B82Y 10/00*** | (2011.01) |
| ***H01L 31/00*** | (2006.01) |
| ***H01L 29/06*** | (2006.01) |
| ***H01L 29/15*** | (2006.01) |
| ***H02S 10/10*** | (2014.01) |
| ***H01L 29/16*** | (2006.01) |

(52) U.S. Cl.

CPC ............. *H01L 31/0583* (2013.01); *B82Y 10/00* (2013.01); *H01L 31/00* (2013.01); *H01L 29/0676* (2013.01); *H01L 29/06* (2013.01); *H01L 29/15* (2013.01); *H01L 29/1606* (2013.01)

USPC .......................................... 136/248; 257/436

(58) Field of Classification Search

CPC ....... Y02E 10/50; Y02E 10/52; Y02E 10/545; Y02E 10/60; H01L 31/022435; H01L 31/02167; H01L 31/02021; H01L 31/0406; H01L 31/0583; H01L 31/00; H01L 31/033435; H01L 29/06; H01L 29/1606; H01L 29/15; H01L 29/0676; B82Y 10/00

USPC ............. 357/77, 428, 431, E31.004; 257/77, 257/428, 431, E31.004, 433, 436, 432; 136/206, 144, 146, 248

See application file for complete search history.

(56) References Cited

U.S. PATENT DOCUMENTS 3,988,166 A * 10/1976 Beam ............................ 136/246
4,559,901 A 12/1985 Morimoto (Continued)

FOREIGN PATENT DOCUMENTS

JP 2007081097 3/2007
KR 20110040254 4/2011

(Continued)

OTHER PUBLICATIONS

"Superconductivity at 28.6 K in a Rubidium-C.sub.60 Fullerene Compound, Rb.sub.x C.sub.60, Synthesized by a Solution-Phase Technique"; Amer. Chem. Soc. 0020-1669/1330-2962.

(Continued)

*Primary Examiner* — Nikolay Yushin

(74) *Attorney, Agent, or Firm* — Fitch Even Tabin & Flannery LLP

(57) ABSTRACT

An apparatus comprising a high-temperature photovoltaic transducer that is disposed between a source of light and another modality of solar energy conversion such that both the high-temperature photovoltaic transducer and the another modality of solar energy conversion generate electricity using a same source of light.

18 Claims, 5 Drawing Sheets

1002

800

(56) References Cited

U.S. PATENT DOCUMENTS 4,629,631 A 12/1986 Dearnaley
4,634,600 A 1/1987 Shimizu
4,663,305 A 5/1987 Mauldin
5,132,105 A 7/1992 Remo
5,200,916 A 4/1993 Yoshida
5,209,916 A 5/1993 Gruen
5,273,788 A 12/1993 Yu
5,308,661 A 5/1994 Feng
5,328,676 A 7/1994 Gruen
5,370,855 A 12/1994 Gruen
5,462,776 A 10/1995 Gruen
5,698,328 A 12/1997 Bunshah
5,772,760 A 6/1998 Gruen
5,894,058 A 4/1999 Hatakeyama
6,007,969 A 12/1999 Hatakeyama
6,010,831 A 1/2000 Hatakeyama
6,020,677 A 2/2000 Blanchet-Fincher
6,048,671 A 4/2000 Hatakeyama
6,183,818 B1 2/2001 Vohra
6,313,392 B1 11/2001 Sato
6,534,923 B2 3/2003 Espinosa
6,592,839 B2 7/2003 Gruen
6,669,996 B2 12/2003 Ueno
6,781,294 B2 8/2004 Sakai
6,783,589 B2 8/2004 Dahl
6,791,108 B1 9/2004 Olivas
6,882,094 B2 4/2005 Dimitrijevic
6,952,075 B2 10/2005 Sakai
7,127,286 B2 10/2006 Mech
7,224,532 B2 5/2007 Dahl
7,259,320 B2 8/2007 Take
7,309,446 B1 12/2007 Kley
7,309,476 B2 12/2007 Carlson
7,312,562 B2 12/2007 Dahl
7,312,582 B2 12/2007 Newman, Jr.
7,572,332 B2 8/2009 Gruen
7,718,000 B2 5/2010 Gruen
7,999,176 B2 8/2011 Flood
8,257,494 B2 9/2012 Gruen
2002/0163414 A1 11/2002 Mayer
2003/0152700 A1 8/2003 Asmussen
2003/0188637 A1 10/2003 Ito
2003/0199710 A1 10/2003 Liu
2003/0221717 A1 12/2003 Dessel
2003/0226423 A1 12/2003 Liao
2004/0016397 A1 1/2004 Carlson
2004/0109328 A1 6/2004 Dahl
2004/0198048 A1 10/2004 Dahl
2004/0198049 A1 10/2004 Dahl
2004/0221795 A1 11/2004 Scarsbrook
2004/0221796 A1 11/2004 Swain
2004/0227138 A1 11/2004 Dahl
2004/0227195 A1 11/2004 Chang
2004/0247515 A1 12/2004 Gardner
2004/0251478 A1 12/2004 Dahl
2005/0008560 A1 1/2005 Kataoka
2005/0019114 A1 1/2005 Sung
2005/0019576 A1 1/2005 Dahl
2005/0168122 A1 8/2005 Dahl
2005/0200260 A1 9/2005 Swain
2005/0233489 A1 10/2005 Nishikawa
2005/0275330 A1 12/2005 Sung
2006/0121279 A1 6/2006 Petrik
2006/0207647 A1 9/2006 Tsakalakos
2006/0222850 A1 10/2006 Xiao
2006/0261719 A1 11/2006 Fox
2006/0269467 A1 11/2006 Khabashesku
2006/0269567 A1 11/2006 Yuen
2007/0082200 A1 4/2007 Gruen
2007/0126312 A1 6/2007 Sung
2007/0137684 A1 6/2007 Gruen
2007/0146910 A1 6/2007 Duston
2007/0187153 A1 8/2007 Bertagnolli
2007/0232074 A1 10/2007 Ravi
2008/0063888 A1 3/2008 Sumant
2008/0087314 A1 4/2008 Xiao
2008/0226840 A1 9/2008 Asmussen
2009/0004092 A1 1/2009 Dolmatov
2009/0017258 A1 1/2009 Carlisle
2009/0042029 A1 2/2009 Havel
2009/0057649 A1* 3/2009 Sutter et al. .................... 257/15
2009/0092824 A1 4/2009 Gruen
2009/0242016 A1 10/2009 Zach
2010/0101621 A1* 4/2010 Xu .............................. 136/206
2010/0279426 A1 11/2010 Tour
2010/0330421 A1 12/2010 Cui
2011/0083737 A1 4/2011 Nishino
2011/0096218 A1 4/2011 Bratkovski
2011/0200825 A1* 8/2011 Chakraborty et al. ........ 428/412
2011/0209744 A1* 9/2011 Hu .............................. 136/248
2012/0034464 A1 2/2012 Chakraborty
2012/0097217 A1* 4/2012 Yin et al. ..................... 136/248
2012/0102843 A1 5/2012 Chakraborty
2012/0132256 A1* 5/2012 Sager .......................... 136/248
2012/0192920 A1* 8/2012 McCowan et al. ............ 136/248
2012/0227787 A1* 9/2012 Drori et al. ................... 136/244
2012/0312343 A1* 12/2012 VanVechten et al. ......... 136/201
2013/0001516 A1 1/2013 Hebard et al.
2013/0040204 A1 2/2013 Liu
2013/0045418 A1 2/2013 Oguni
2013/0099196 A1 4/2013 Wu
2013/0206199 A1* 8/2013 Lassiter et al. ............... 136/206

FOREIGN PATENT DOCUMENTS

KR 20110056744 5/2011
WO 2007127727 11/2007
WO 2010053997 5/2010
WO WO 2010/132868 * 5/2010 ............ H01L 31/042

OTHER PUBLICATIONS

A. Das, S. Pisana, B. Chakraborty, S. Piscanec, S. K. Saha, U. . Waghmare, K. S. Novoselov, H. R. Krishnamurthy, A. K. Geim, A. C. Ferrari, A. K. Sood, "Monitoring Dopants by Raman Scattering in an Electrochemically Top-Gated Graphene Transistor," Nature Nanotechnology, 3, pp. 210-215 (2008).
Angus, John C. et al; "Metastable Growth of Diamond and Diamond-Like Phases"; Annu. Rev. Mater. Sci. 1991. 21:221-48.
Anne Simon Moffat; "When Diamonds Met Buckyballs" Science vol. 254. Science New Series, vol. 254, No. 5033 (Nov. 8, 1991), p. 800, Published by: American Association for the.
B. Liu, J. Boercker and E.S. Aydil, "Oriented Single Crystalline Titanium Dioxide Nanowires," Department of Chemical Engineering and Materials Science, pp. 1-7 © 2008 IOP Publishing Ltd.
B. Liu and E.S. Aydil, "Growth of Oriented Single-Crystalline Rutile TiO2 Nanorods on Transparent Conducting Substrates for Dye-Sensitized Solar Cells," J. Am. Chem. Soc., pp. 3985-3990, 2009.
Beck, Ranier D., et al, "Resilience of All-Carbon Molecules C.sub.60 and C.sub.84 : A Surface Scattering Time-of-Flight Investigations"; J. Chem. Phys. 1991, 95, 8402-8409.
C. Feng-Ping, Z. Yu-Ming, Z. Yi-Men, T. Xiao-Yan, W. Yue-Hu, and C. Wen-Hao, "Temperature-Dependent Characteristics of 4H—Sic Junction Barrier Schottky Diodes," Chin. Phys. 13, 21., pp. 037304-1 to 037304-5 (2012).
C. Pfuetler, M. Ramstelner, 0. Brandt, F. Grosse, A. Rathsfeld, G. Schmidt, L. Geelhaar, and H. Riechert, "Raman Spectroscopy as a Probe for the Coupling of Light Into Ensembles of Sub-Wavelength-Sized Nanowires," Appl. Phys. Letters, 101 083104 (2012).
Curl, Robert F. et al; "Fullerenes"; Sci Amer. Oct. 1991, 54-63.
D. M. Gruen, M. H. Mendelsohn, and M. Kirk, "Growth and Morphology of Graphene on Silicon Carbide Nanoparticles," Materials Research Society Proceedings vol. 1411 (2012); doi: 10.1557/002012.1090; pp. 1-10.
D. Spry, P. Neudeck, R. Okojie, L-Y Chen, G. Beheim, R. Meredith, W. Mueller, and T. Ferrier, "Electrical Operation of 6H—SiC MESFET at 500C for 5000 Hours in Air Ambient," 2004 IMAPS Int. Conference and Exhibitionn on High Temperature Electronics (inc 2004) May 19-12, 2004, Santa Fe, NM, Int. Microelectronics and Packaging Society (IMAPS) Washington, DC, 2004.

(56) References Cited

OTHER PUBLICATIONS

E. Garnett, and P. Yang,"Light Trapping in Silicon Nanowire Cells," Nano Letters 10, pp. 1082-1087 (2010).
Edelson, Edward; "Buckyball The Magic Molecule"; Popular Science, Aug. 1991, 52-57; 87.
Frenklach, Michael et al; "Growth Mechanism of Vapor-Deposited Diamond", J. Mater. Res. 3(1) Jan./Feb. 1988, 133-139.
G. A. Landis, D. Merritt, R. P. Raffaelle, D. Scheiman, "High. Temperature Solar Cell Development," NASA/CP.-2005-213431; pp. 241-247 (2002).
G. A. Landis, P. Jenkins, D. Scheiman, R. Rafaelle,"Extended Temperature Solar Cell Technology Development," AIAA 2nd int. Energy Conversion Engineering Conf., Providence, RI , pp. 1-7 (2004).
Gruen; "Diamonds From Dust" Submitted to Materials Technology May 1994.
Gruen et al.; "Buckyball Microwave Plasmas: Fragmentation and Diamond-Film.Growth" J. Appl. Phys. 75 (3), Feb. 1, 1994.
Gruen et al.; "Fullerenes as Precursors for Diamond Growth Without Hydrogen or Oxygen Additions" Appl. Phys. Lett. 64 (12) Mar. 21, 1994.
Gruen et al.; "Turning Soot Into Diamonds with Microwaves" Submitted for Presentation at the 29th Microwave Power Symposium, Jul. 25-27, 1994.
H. Y Kim, J. Park, and H. Yang, "Direct Synthesis of Aligned Silicon Carbide Nanowires From the Silicon Substrates," Chem. Comm., 256 (2003).
H.Y. Kim, S.Y. Bae, S.S. Kim and J. Park, "Fabrication of SiC—C Coaxial Nanocables: Thickness Control of C Outer Layers," Chem. Com. 2634-2635 (2003).
International Preliminary Report on Patentability dated Nov. 4, 2008 from PCT/US2007/067297.
International Search Report and Written Opinion dated Oct. 16, 2008 Cited from PCT/US08/67297.
International Search Report and Written Opinion Dated Oct. 16, 2008 from PCT/US08/67297.
J.A. Edmond, H. Kong and C.H. Carter, Jr., "Blue LEDs, UV Photodiodes and High-Temperature Rectifiers in 6H—SiC" Physica B 185 (1993) 453-459 North-Holland.
J.C.C. Fan, "Theoretical Temperature Dependence of Solar Cell Parameters," Solar Cells, 17, 309 (1986).
J.E. Boercker, E.Enache-Pommer and E.S. Aydil, "Growth Mechanism of Titanium Dioxide Nanowires for Dye-Sensitized Solar Cells," Department of Chemical Engineering and Materials Science, University of Minnesota, pp. 1-10 © IOP Publishing Ltd., Nanotechnololgy 19 (2008).
K. Zhu, N.R. Neale, A. Miedaner and A.J. Frank; "Enhanced Charge-Collection Efficiencies and Light Scattering in Dye-Sensitized Solar Cells Using Oriented Ti02 Nantubes Arrays," published on Web Dec. 2, 2006; American Chemical Society.pp. 69-74; Nano Letters vol. 7 (2007).
Kratschmer, W. et al.; "Solid C.sub.60 : A New Form of Carbon", Nature, vol. 347, Sep. 27, 1990, pp. 354-358.
Kroto, H. W. et al; "C.sub.60 : Buck Minster Fullerene"; Chem. Rev. 1991, 91, 1213-1235.
Lykke, K. R. et al., "Spectrometric Characterization of Purified C.sub.60 and C.sub.70"; Mats. Res. Soc. Symposium Proc. vol. 206, 679 (1991).
Meijer, Gerard et al; "Laser Deposition of Carbon Clusters on Surfaces: A New Approach to the Study of Fullerenes"; J. Chem. Phys. 93(11), Dec. 1990.
Meilunas et al.; "Nucleation of Diamond Films on Surfaces Using Carbon Clusters" Applied Physics Letters, vol. 59, No. 26, Dec. 23, 1991.
Parker, D. H. et al, "High Yield Synthesis, Separation and Mass Spectrometric Characterization of Fullerenes C.sub.60 to C.sub. 266", J. Am. Chem. Sco. 113, 7499-7503 (1991).
R. Voggu, B. Das, C. S. Rout, C. N. R. Rao, "Effects of Interaction of Electron-Donor and" Acceptor Molecules on the Electronic Structure of Graphene, arxiv.org/pdf/0808.3165, pp. 1-10 (2009).
R.R. Nair, P. Blake, A.N. Grigorenko, K.S. Novoselov, T. J. Booth, T. Stauber, N.M.R. Peres and A.K. Geim; "Universal Dynamic Conductivity and Quantized Visible Opacity of Suspended Graphene;" Manchester Centre for Meoscience & Nanotechnology, University of Manchester, M13 9POL, Manchester, UK, Graphene Industries Ltd., 32 Holden Avenue, M16 8TA, Manchester, UK and Department of Physics, University of Minho, P-4710-057, Braga.
S. Bailey, G. Landis, A. Hepp, R. Raffaelle, "Future Photovoltaic Power Generation for Space-Based Power Utilities," IAF-02-R.4.06 Selnt. Astronautical Congress/The World Space Congress (2002).
S. Pisana, M. Laueri, C. Casiraghi, K. S. Novoselov, A. K. Geim, A. C. Ferrari, and F. Mauri, "Breakdown of the Adiabatic Born-Oppenheimer Approximation in Graphene," Nature Materials, 6, pp. 198-201 (2007).
S. Shivaraman, L. H. Herman, F. Rana, J. Park, and M. G. Spencer, "Schottky Barrier Inhomogeneities At the Interface of Few Layer Epitaxial Graphene and Silicon Carbide," Appl. Phys. Lett., 100 183112 (2012).
S. Tongay, M. Lemaitre, X. Miao, B.R. Appleton and A.F. Hebard; Rectification at Graphene-Semiconductor Interfaces: Zero-Gap Semiconductor-Based Diodes,: American Physical Society; pp. 1-10; Received May 24, 2011; Published Jan. 17, 2012.
S. Tongay, T. Schumann and A.F. Hebard; Graphite Based Schottky Diodes Formed on Si, GaAs, and 4H—SiC Substrates; Applied Physics Letters 95, 222103 (2009).
S. Vizzini, H. Enriquez, S. Chiang, H. Oughaddou and P. Soukassian, "Nano-Structures Developing at the Graphene/Silicon Carbide Interface," Surface Science, 605 pp. L6-L11; (2011).
S.K. Sarkar, J.Y. Kim, D.N. Goldstein, N.R. Neale, K. Zhu, C.M. Elliott, A.J. Frank and S.M. George, "IN2S3 Atomic Layer Deposition and Its Application as a Sensitizer on TiO2 Nanotube Arrays for Solar Energy Conversion," Published on Web Apr. 13, 2010; American Chemical Society, pp. 8032-8039; J. Phys. Chem. C.
T. J. Anderson, K. D. Hobart, L. 0. Nyakiti, V. D. Wheeler, R. L. Myers-Ward, J. D. Caldwell, F. J. Bezares, G. G. Jernigan, M. J. Tadjer, E. A. Imhoff, A. D. Koehler, D. K. Gaskill, C. R. Eddy, snf F. J. Kub, "Investigation of the Epitaxial Graphene/p-SIC , junction," IEEE Electron Device Letters, 33, pp. 1610-1612 (2012).
T. Zimmermann, M. Kubovic, A. Denisenko, K. Janischowsky, O.A. Williams, D.M. Gruen and E. Kohn; "Ultra-Nano-Crystalline/Single Crystal Diamond Heterstructure Diode;" Elsevier B.V.; Science Direct; Diamond and Related Materials ; pp. 416-420; © 2005.
Van, Jon; "Exotic Form Opens New Carbon Uses," Chicago Tribune, Sunday, Nov. 3, 1991.
Wasielewski, M. R., et al "Triplet States of Fullerenes C.sub.60 and C.sub.70"; Electron Paramagnetic Resonance Spectra, Photophysics and Electronic Structures, J. Am. Chem. Soc. 113, 2774-2776 (1991).
Wurz, P. and Lykke, R.; "Delayed Electron Emission from Photoexcited C.sub.60."; J. Chem Phys. 95, 7008-7010 (1991).
Y. Zhuo; C. Wu, S. Han, B. Chi, J. Pu, T. Jin and L. Jian, "Oriented Nanostructured Titanates Array From Low Concentration Alkaline Solution via Hydrothermal Process," J. Nanosci. Nanotechnol. 2011, vol. 11, No. 3, pp. 2298-2303.
Z. Liu, S. Wang, F. Yu, Y. Zhang and H Zhao, "Ti Schottky Barrier Diodes on n-type 6H—Sic," 0-7803-6520-8/01/$10.00, pp. 1183-1186, © 2001 IEEE.
"Silicon Carbide High-Temperature Power Rectifiers Fabricated and Characterized," http://www.grc.nasa.gov/WWW/RT/RT1995/2000/2510n.htm; Jan. 23, 2013.
PCT Patent Application No. PCT/US2013/053919; International Search Report and Written Opinion Dated Nov. 28, 2013.

* cited by examiner

500

600

700

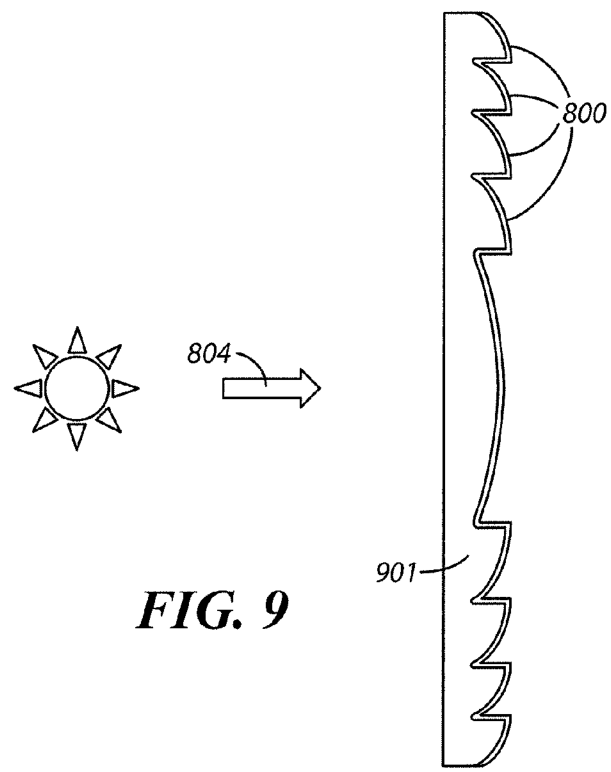
FIG. 9
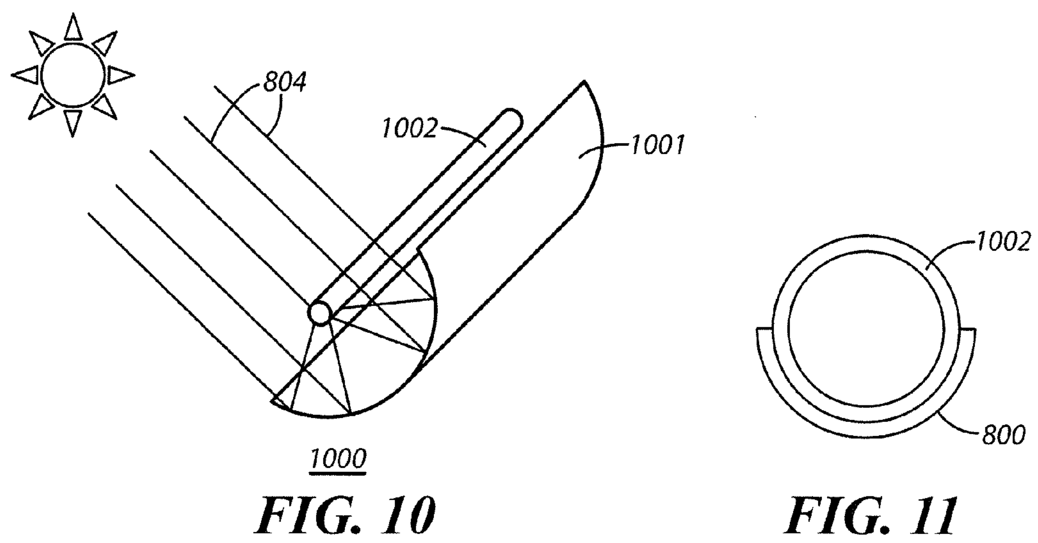
FIG. 10
FIG. 11

APPARATUS PERTAINING TO THE CO-GENERATION CONVERSION OF LIGHT INTO ELECTRICITY

RELATED APPLICATION(S)

This application claims the benefit of U.S. Provisional application No. 61/681,873 entitled Graphene Shell/Core Nanostructures and filed Aug. 10, 2012, which is incorporated by reference in its entirety herein.

This application is also a continuation-in-part of co-owned U.S. patent application Ser. No. 13/682,229 entitled Apparatus Pertaining to a Core Wide Band-Gap Material Having a Graphene Shell and filed Nov. 20, 2012, which is incorporated by reference in its entirety herein.

TECHNICAL FIELD

This invention relates generally to the generation of electricity using solar energy.

BACKGROUND

Various modalities of solar energy conversion are known in the art. It is known, for example, to employ photovoltaic junctions in favor of converting sunlight directly into electricity. It is also known to convert sunlight into heat and to then utilize that heat to generate electricity.

That such approaches are known, however, is not a panacea in and of itself. Various implementation and operating problems arise with each such modality of solar energy conversion. Conversion efficiency, for example, varies amongst different modalities with many posited modalities performing quite poorly and none achieving high conversion efficiency. Those relative conversion efficiencies, in turn, quite directly impact the return on investment an enterprise can expect to receive for pursuing a given solar energy conversion system.

Dispatchability is another such example. Dispatchability refers to an ability to contribute electricity to a distribution grid at times of need. Since solar energy conversion requires the presence of the sun, converting solar energy into electricity cannot occur at night in the absence of an energy-storage mechanism. Energy storage can give rise to new concerns, however. Using batteries on a large scale for energy storage, for example, is relatively expensive in a variety of ways.

BRIEF DESCRIPTION OF THE DRAWINGS

The above needs are at least partially met through an apparatus pertaining to the co-generation conversion of light into electricity described in the following detailed description, particularly when studied in conjunction with the drawings, wherein:

FIG. 9 comprises a side-elevational schematic view as configured in accordance with various embodiments of the invention;

FIG. 10 comprises a perspective schematic view as configured in accordance with various embodiments of the invention;

FIG. 11 comprises a side-elevational schematic view as configured in accordance with various embodiments of the invention.

Figure 1:
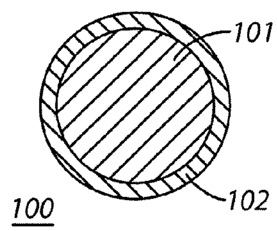
FIG. 1 comprises a side-elevational, sectioned schematic view as configured in accordance with various embodiments of the invention.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments, a corresponding apparatus can comprise a first modality of solar energy conversion that is disposed between a source of light and a second modality of solar energy conversion. So configured, both the first modality of solar energy conversion and the second modality of solar energy conversion can independently generate electricity using a same source of light. (As used herein, this reference to a "second" modality will be understood to not merely refer to a numerically additional or supplemental modality but will instead be understood to refer to another and different-in-kind modality as compared to the first modality of solar energy conversion.)

By one approach the first modality of solar energy conversion comprises a graphene-based modality of solar energy conversion. The graphene-based modality of solar energy conversion can comprise a photovoltaic transducer that directly converts light into electricity. By one approach the second modality of solar energy conversion serves to convert heat into electricity. In such a case, the graphene-based modality of solar energy conversion can be disposed directly on a heat-absorbing surface that comprises a part of the second modality of solar energy conversion. That heat-absorbing surface, for example, can comprise a fluid-carrying conduit.

Fluids employed in such a second modality of solar energy conversion can be in excess of 350 degrees Centigrade. Such temperatures, of course, are quite inhospitable to the functioning of many ordinary photovoltaic devices that employ silicon or gallium arsenide. Graphene, however, is capable of operating in a satisfactory manner at such temperatures. Accordingly, a graphene-based photovoltaic junction can be expected to maintain photovoltaic functionality at a useful level of energy conversion notwithstanding the high temperatures of the adjacent second modality of solar energy conversion.

Accordingly, so configured, such a system comprises a cogeneration system for converting light into electricity. Depending upon the design employed the relative conversion efficiency of each modality can be relatively similar. By one approach, electricity generated by the graphene-based modality of solar energy conversion can be provided in real time to a distribution grid. Heat generated by the second modality of solar energy conversion, however, can be utilized immediately to generate electricity or can be stored and utilized later (for example, during a late afternoon period of peak loading and/or during the evening hours) to generate electricity to contribute to the distribution grid.

Such a co-generation facility offers other advantages beyond the improved dispatchability capability noted above. For example, the relative cost of such a co-generation facility need not be appreciably more than the cost of building and operating the second modality of solar energy conversion as an isolated system. To some very real extent, the present teachings permit leveraging the availability of such a system by greatly increasing the power output of the overall system while greatly enhancing the ability to time shift the distribution of the generated electricity. Accordingly, the present teachings offer a highly flexible approach to generating and distributing electricity.

Graphene is a substance made of pure carbon, with atoms arranged in a regular hexagonal pattern similar to graphite, but in a one-atom thick sheet (hence leading to the oft-used graphene descriptor "two-dimensional"). Graphene is the basic structural element of many carbon allotropes including graphite, charcoal, carbon nanotubes, and fullerenes. Graphene has a number of interesting optical, electrical, and thermal properties and has been the subject of much recent research. For example, the 2010 Nobel Prize in Physics went to researchers working on "groundbreaking" experiments involving graphene.

A single layer of graphene is nearly transparent. That said, however, a stack of forty-three graphene layers has an opacity of about ninety-nine percent and essentially completely absorbs light throughout the visible and near infrared regions of the solar spectrum notwithstanding having a film thickness of less than fifteen nanometers.

Referring now to the drawings, FIG. 1 depicts an object 100 having a core 101 that consists essentially of a wide band-gap material. This reference to a wide band-gap material will be understood to refer to a material having a valence band and a conduction band that differ by at least two electron volts. The reference to the core 101 consisting essentially of this material will be understood to refer to a core 101 that is largely pure in these regards but which can include trace impurities (and which can also include, for example, purposefully-introduced n-type or p-type dopants designed to elicit specific electrical performance).

In FIG. 1 the core 101 comprises a sphere. As will be shown below the core 101 can in fact assume any of a wide variety of regular and irregular forms. That said, by one approach the core 101 has at least one nanoscale bisectional dimension that does not exceed, for example, one hundred nanometers. This requirement does not specify that all dimensions of the core 100 are so limited, however. When the core 101 comprises, for example, a nanorod the core 101 might have a longitudinal length in excess of many hundreds of nanometers. (It is not necessary that the referred-to bisector divide the core 101 into two equal halves. Instead, as used herein a reference dimension is a "bisector" if the corresponding line passes through opposing points on the periphery and includes a geometric center of the core 101 as per a corresponding frame of reference. For example, when the core 101 comprises a cylinder, a lateral cross-sectional diameter of that cylinder can serve as a bisector for these purposes.)

The depicted object 100 also has a shell 102 consisting essentially of graphene conformally disposed about at least a substantial portion of the core. As used herein this reference to "substantial" will be understood to refer to an amount in excess of fifty percent.

The thickness of this graphene shell 102 can vary with the application setting. For many purposes, however, the thickness can range from about one layer to about forty-three layers or so. Accordingly, for many purposes the thickness of the shell 102 is very thin. Generally speaking, when employed in a photovoltaic setting, the number of layers need be no more than are required to achieve a particular amount of light absorption (for example, forty-three layers of graphene will absorb nearly all incident light). It will be presumed herein that the shell 102 has an essentially uniform thickness for a given object 100 but these teachings will accommodate variations in these regards if desired and/or as appropriate to the needs of a given application setting.

Generally speaking, electron/hole recombination rates are dependent on a variety of factors. In order to achieve a high efficiency solar cell, the material selected for the core 101 can be chosen to optimize charge separation in preference to electron/hole recombination.

By one approach, the shell 102 is conformally applied to the core 101 by contacting a reactant at elevated temperatures with nanopowders of different compounds such as borides, carbides, nitrides, oxides, and sulfides. Typical examples of such compounds are boron carbide, silicon carbide, silicon nitride, silicon oxide, titanium oxide, zinc oxide, iron sulfide, and so forth.

More particularly, by one approach the corresponding synthesis carries out the reaction(s) using size and shape-selected nanopowders of the selected material for the core 101. Per the reaction, hydrocarbon molecules decompose on the surfaces of the nanopowders to form the graphene layer(s) that comprises the shell 102. In particular, the nanomaterials cited above act as catalysts for the reactions to form graphene and result in highly unusual core/shell nanostructures in which the shell 102 is graphene and the cores 101 are composed of nanoparticles of the particular starting material. Additions of dopants during or after synthesis allows their incorporation into the shell or functionalization of the shell to produce desired dopant levels.

By one approach the reactions to form the graphene occur with first order kinetics at temperatures that are typically about 1000 degrees Centigrade lower in the presence than in the absence of the nanopowders. At least one reason for this dramatic lowering in reaction temperature is believed to be the ubiquitous presence of defects of various kinds on the surfaces of the nanomaterials. Because of the large surface area of the nanomaterials (relatively speaking) and the lowering of the activation energies of the reactions due to the presence of defects, the reaction kinetics are rapid at modest reaction temperatures.

The reaction rates are largely determined by temperature and temperature, of course, can be carefully controlled. Shell 102 thickness (i.e., the number of graphene layers), however, is largely controlled by the length of time the reaction is allowed to proceed at a controlled temperature. A layer-bylayer growth mechanism is therefore inherent in the presently-disclosed synthesis method making this a very powerful way of precisely controlling a key parameter that can serve as an important determinant of the ultimate performance of the material in a solar cell device.

This extremely versatile aspect of the described one-step synthesis method therefore allows one to adjust, in addition to core size and composition, the shell thickness parameter so as to be able to optimize the graphene photophysics. As alluded to above, the photophysics of graphene (involving excited-state transition lifetimes and charge-transport kinetics) can be highly useful to achieve a highly-efficient and commercially-viable solar cell. For example, a film consisting of 20 nanoparticles (each sized from around ten to eighty nanometers) that each have a monolayer graphene shell 102 would have a thickness of about 200-1600 nanometers and would absorb around ninety-five percent of the incident light. Such a very thin film solar cell would be expected to operate at considerably higher efficiencies while being considerably less costly than prior art solar cells.

Figure 2:
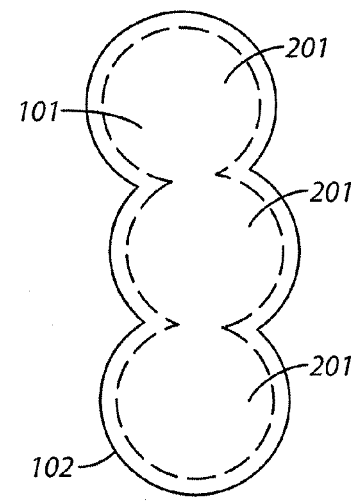
FIG. 2 comprises a side-elevational schematic view as configured in accordance with various embodiments of the invention.

The examples above presumed to encapsulate individual small particles with a graphene shell. These teachings will accommodate other approaches, however. By one approach, for example, the core 101 can comprise a plurality of nanoparticles 201 that are annealed to one another as illustrated in FIG. 2. In this simple example the resultant nanowire of the wide band-gap material comprises three sequentially-connected nanoparticles 201. It will be understood, of course, that such a nanowire can comprise a considerably larger number of such nanoparticles 201. Accordingly, although the lateral cross section of such a nanowire may remain within the aforementioned one hundred nanometer bisectional dimensional limitation the length of the nanowire can be of essentially any dimension of choice. By one approach the shells are applied subsequent to the annealing step.

By way of a more specific example (but without intending any specific limitations by way of these corresponding details), silicon carbide nanowires can be synthesized in a variety of ways. For example, chemical vapor deposition procedures can serve in these regards. As another example, silicon carbide nanoparticles can be heated to 2000K in the presence of a catalyst such as iron powder.

The graphene shells 102 surrounding the nanowires can in turn be synthesized to a predetermined thicknesses by reaction of the nanowires with carbonaceous substances at elevated temperatures as already stated or by heating the nanowires in vacuum to 1500K or in one bar of argon to 2000K. One straightforward and economically attractive synthesis procedure for objects 100 having a silicon carbide nanowire core 101 and a graphene shell 102 would comprise heating commercial silicon carbide powders to 2000K in argon to grow the nanowires, following which the catalyst is removed and the resultant material then reheated to 2000K in argon to form epitaxial graphene layers to a predetermined thickness and doping level.

Figure 3:
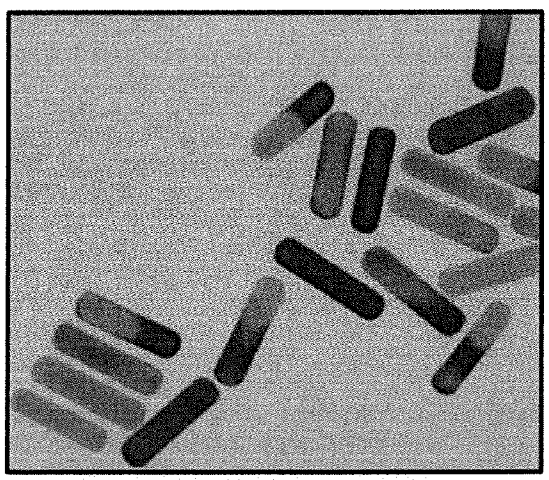
FIG. 3 comprises a top plan view as configured in accordance with various embodiments of the invention.
Figure 4:
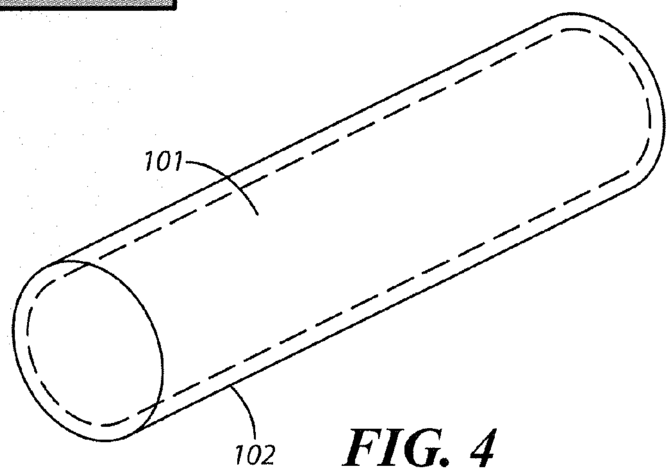
FIG. 4 comprises a perspective schematic view as configured in accordance with various embodiments of the invention.
Figure 5:
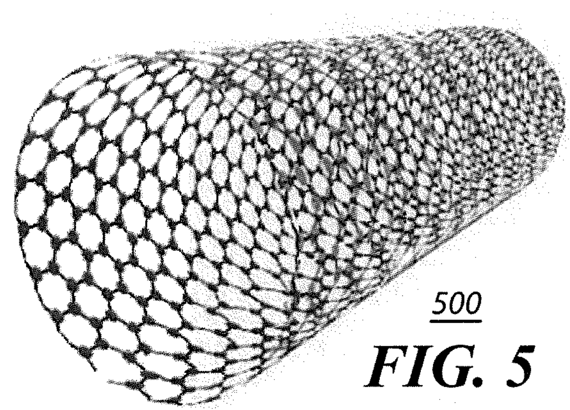
FIG. 5 comprises a perspective view as configured in accordance with various embodiments of the invention.
Figure 6:
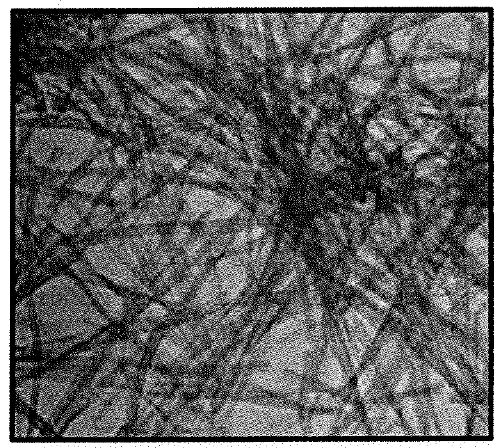
FIG. 6 comprises a top plan view as configured in accordance with various embodiments of the invention.
Figure 7:
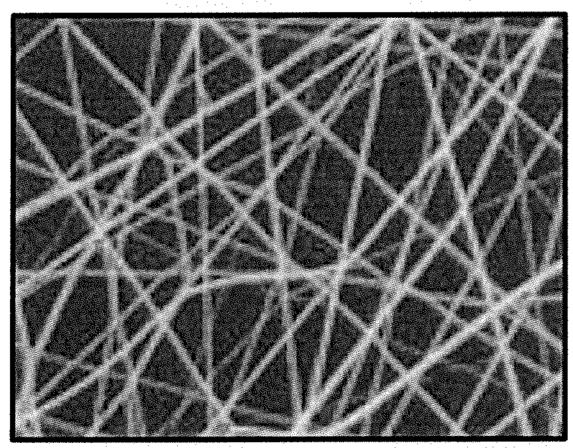
FIG. 7 comprises a top plan view as configured in accordance with various embodiments of the invention.

It may be noted and emphasized that these teachings will accommodate using cores 101 having any of a wide variety of forms. With reference to FIG. 3, for example, the cores 101 can comprise nanorods 300. As illustrated in FIG. 4, a graphene shell 102 of a desired thickness can then be readily conformally applied to such a core 101. By way of further illustrative examples, FIG. 5 illustrates a core 101 comprising a nanotube 500, FIG. 6 illustrates cores 101 comprising nanofibrils 600, and FIG. 7 illustrates a core 101 comprising a nanofabric 700. Again, these examples are intended to represent a non-exhaustive listing of possibilities in these regards.

Generally speaking, a viable solar cell will comprise a plurality of such objects 100 and hence will comprise a plurality of cores 101 that each have a shell 102 disposed thereabout. By one useful approach, when the cores 101 comprise generally longitudinal members (such as nanowires, nanorods, and/or nanotubes), the plurality of cores 101 can be disposed with their longitudinal axes oriented at least substantially parallel to one another. In particular, by one approach these longitudinal axes are also oriented substantially coaxial and parallel to anticipated light beams.

Figure 8:
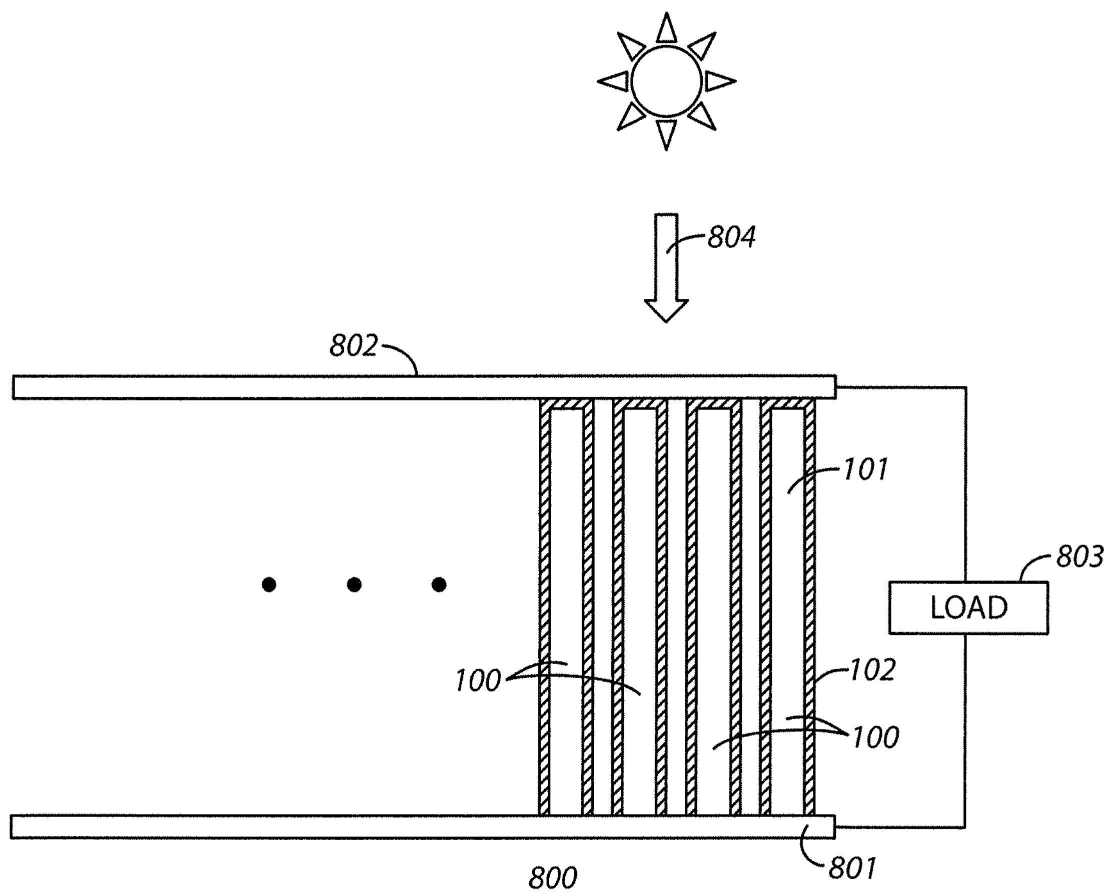
FIG. 8 comprises a side-elevational schematic view as configured in accordance with various embodiments of the invention.

FIG. 8 presents one illustrative example in these regards. In this illustrative example a solar cell 800 has a first electrical pathway 801 and an opposing second electrical pathway 802 (the latter being transparent or at least translucent to permit light 804 to pass therethrough). These two electrical pathways 801 and 802 in turn couple to an electrical load 803 of choice such as but not limited to an electricity-distribution grid (via, for example, one or more transformers, regulators, and so forth as desired).

In this example, each of the cores 101 physically and electrically connects to the first electrical pathway 801 but not to the second electrical pathway 802. By one approach, the longitudinal axes of these cores 101 can range from about two hundred nanometers to no more than about five thousand nanometers.

By one approach, the nanowires that comprise the cores 101 in this example essentially consist of silicon carbide and have a length of from about three hundred to about five thousand nanometers and cross-sectional diameters of from about ten to about eighty nanometers coaxially. These cores 101 are surrounded by anywhere from a monolayer forty-three or so layers of graphene that essentially constitute the graphene shells 102.

These aligned silicon carbide cores 101 can be grown prior to growing the shells 102 by reacting a dilute mixture of methane in hydrogen with a silicon substrate carrying a catalyst to enable a vapor-liquid-solid growth mechanism. By one approach the catalyst facilitates the growth of aligned silicon carbide nanowires. A catalyst that forms a gallium/iron/silicon alloy, for example, allows the reaction with the carbon in the methane to occur in such a way as to lead to the growth of aligned silicon carbide nanowires.

The aligned silicon carbide nanowires can be grown to the desired length by allowing the reaction to occur for a corresponding length of time at a temperature of about 1300 to about 1600 K. When the desired nanowire length has been reached, the gas mixture flowing over the nanowires is changed to pure methane to thereby create conditions for growing the graphene shells 102. Again, the number of layers in the shells 102 is controlled by the length of time growth is allowed to proceed at a given temperature.

The bottoms of the resulting nanowire nanostructures are attached to the first electrical pathway 801 that comprises, for example, silicon or some other conducting base, thus electrically connecting all of the cores 101. The tops of the nanowires carry graphene layers that are in electrical contact with all of the coaxial graphene shells 102 surrounding the nanowire cores 102. The growth process thus automatically creates a solar cell nanostructure that provides separate electrical connections to cores 101 and shells 102.

By one approach, dark current and majority carrier transport can be minimized by preventing contact of the coaxial graphene shells 102 with the silicon base and with the silicon carbide nanowire cores. This can be accomplished, for example, by chemical vapor deposition of a monolayer or multilayers of an insulator such as silicon dioxide prior to depositing the graphene shells 102.

Solar energy conversion efficiency associated with such a configuration is strongly enhanced in the nanostructured radial coaxial shell/core nanowire configuration over conventional planar solar cell configurations in part because electron diffusion lengths are very much shorter. This is particularly the case with regard to the thin graphene shells 102.

In addition, it may be observed that such a solar cell functions by virtue of the internal photoemission of energetic electrons emanating from the graphene layers and that are injected into the conduction band of the silicon carbide cores 101 upon irradiation by light. The tens of milliamperes per square centimeter of photocurrent produced in this way is expected to have energies of about one electron volt under standard sunlight intensities. The stated cell performance is due in part to the potential barrier created when graphene forms a junction with silicon carbide. The magnitude of this potential barrier is estimated to be somewhat less than one electron volt based on calculations using the Anderson approximation which employs known values of quantities such as the work functions, electron affinities and electrical conductivities of graphene and silicon carbide.

The described graphene/silicon carbide junction is also noteworthy in that the junction joins graphene (a zero band-gap material in which electrons behave as if they were massless fermions obeying Dirac wave functions according to the theory of quantum electrodynamics) to a wide band-gap semiconductor, silicon carbide, in which electrons obey the dictates of quantum mechanics. One of the functions of this junction, whose width is less than one nanometer, is to effectively transform "Dirac" electrons into "Schroedinger" electrons during the process of photoemission while concurrently minimizing the recombination of electrons with holes.

Generally speaking, restructuring of the atoms constituting such a junction has been shown to occur during junction synthesis. This restructuring still further enhances the interfacial area thus facilitating the complex functions of the junction. It is known, for example, that the position of the Fermi level of graphene changes at the heterojunction with a wide band-gap semiconductor. This exceptional circumstance does not occur with other metal/semiconductor heterojunctions at least in part because unlike the very large number of quantum states found with ordinary metals, graphene has only a small number of states near the Fermi level. The unique quantum physics of the graphene/semiconductor heterojunction is expected to benefit the characteristics of quantum structured solar cells such as their dark current behavior.

A useful attribute of a graphene/silicon carbide solar cell is its temperature stability. Both graphene and silicon carbide are high-temperature materials in that they have very high melting points and are thermodynamically stable. Diffusional processes of dopants in these materials are very slow at temperatures up to about 1000K thus helping to preserve the rectifying properties of the corresponding Schottky barrier up to temperatures of at least 600K.

The graphene/wide band-gap semiconductor materials all share these attributes with graphene/silicon carbide being an example. The graphene/wide band-gap materials are therefore uniquely capable of functioning as high-temperature solar cells in a co-generation application setting.

By one illustrative approach, and referring to FIG. 9, such solar cells 800 can be employed in conjunction with one or more Fresnel lenses 901 including linear Fresnel lens installations. By one approach, and as illustrated, it would even be possible to dispose the solar cells 800 directly on the lens 901 itself.

By way of another illustration and referring now to FIGS. 10 and 11, solar cells employing the present teachings can be applied in combination with a second modality of solar energy conversion such as a solar-heat based system 1000 having fluid-carrying tubes 1002 that absorb heat from sunlight 804 reflected from a corresponding parabolic trough solar collector 1001. In particular, and as illustrated in particular in FIG. 11, solar cells 800 as described herein can be externally disposed on at least a portion of the liquid-carrying conduit 1002 itself (such as on a portion of the conduit 1002 that receives the reflect light from the parabolic trough solar collector 1001).

Figure 12:
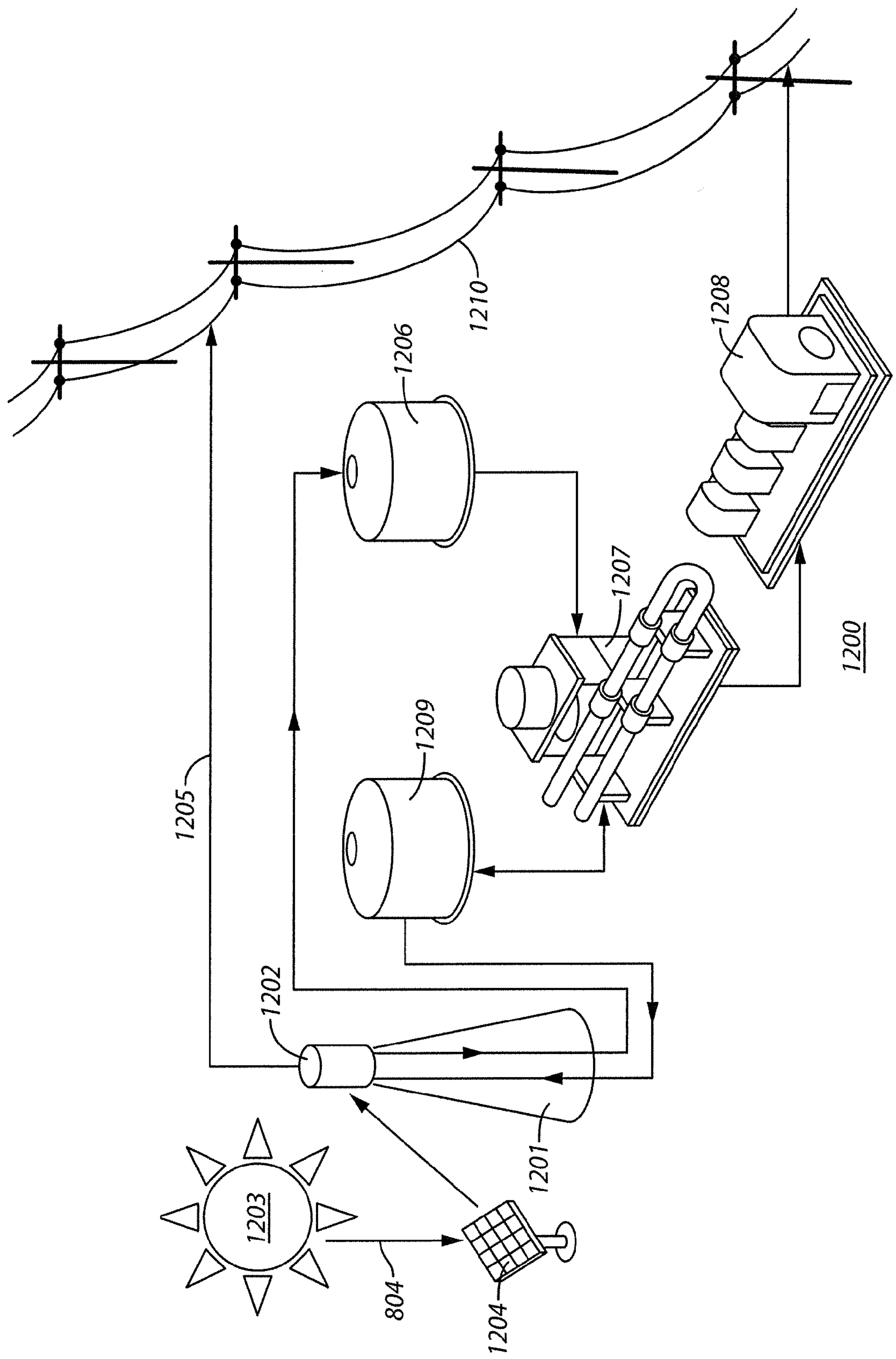
FIG. 12 comprises a block diagram view as configured in accordance with various embodiments of the invention.

FIG. 12 provides another illustrative example in these regards. In this example a co-generation facility 1200 employs a tower 1201 having a solar collector section 1202. Light 804 (from a star such as the Earth's sun 1203) may be received at the solar collector section 1202 directly from the light source but is also received, in a relatively greater quantity, as reflected from (typically) a plurality of solar reflectors 1204.

In this example the solar collector section 1202 includes one or more fluid-carrying conduits (for example, as shown in FIGS. 10 and 11) that carry a fluid, such as a molten salt, that is heated by the received light. As described above, graphene-based photovoltaic transducers are again directly disposed on these conduits and serve to directly convert received sunlight into electricity. This electricity can be directed via one or more conductors 1205 to a distribution grid 1210 or, if desired, to an electricity-storage facility such as a bank of batteries.

The aforementioned hot fluid (which can exceed four hundred degrees Centigrade at operating temperatures) flows in this system to a storage tank 1206 where the heat can be banked until needed. When needed, that heat drives a steam generator 1207 that provides steam to a turbine generator 1208 that generates electricity to be provided to the distribution grid 1210. Cooled/cooling salt in such a system can be passed to and stored in a cold salt storage tank until needed.

So configured, direct conversion of photons to electricity is provided by the solar cells 800 while the associated heat is converted to electricity via, for example, conventional electromagnetic induction technology. Such a co-generation solar-based system can potentially convert around fifty percent of the solar flux energy content at moderate temperatures to electricity with photovoltaics and electromagnetic induction making roughly equal contributions.

The efficiency of graphene shell/silicon carbide nanowire core solar cells depends not only on the nature of the junction between them as explained above but also on the ability of light to be absorbed by the nanostructured graphene shells in the first instance. In particular, in two out of three dimensions, such nanowires are small as compared to the wavelength of solar radiation. In fact, the absorption of light appears to be enhanced by about a factor of two for such nanowires as compared to bulk material. At least part of the reason for this appears to be that electromagnetic radiation enters or is transmitted by the aligned nanowires along their entire length. Thus, the large surface-to-volume ratio (compared to bulk materials) contributes significantly to the quantity of absorbed light.

As a result, radiation is absorbed very efficiently by such graphene shell/silicon carbide nanowires. Furthermore, the light is distributed over a large graphene surface area because the graphene shells 102 surround each nanowire in such an embodiment. It is likely therefore that much higher radiation intensities can be tolerated by such nanostructured cells.

Each one of the vast numbers of graphene shell/silicon carbide nanowires present in such a photovoltaic device comprises a unique structure that individually acts as an effective nantenna and optical rectifier. Calculations for cylindrical nanowires of radius twenty nanometers show that total light absorption occurs for nanowire lengths of about four hundred nanometers (which is, in turn, in the range of the wavelengths of visible light). Each graphene/silicon carbide nanowire can therefore be seen to simultaneously possess both the light (electromagnetic wave) gathering power of an antenna and the rectifying properties of a photovoltaic device.

The opacity of graphene (which is generally independent of the wavelength of light), combined with its use as a nantenna shell surrounding the silicon carbide nanowires, helps to ensure maximal harvesting of the incident sunlight. Consequently, the high solar collection efficiency of these graphene-based nantennas coupled with the highly efficient rectification properties of the graphene/silicon carbide junctions combine to create a new and highly efficient class of solar cells.

In addition to such clear benefits as an enabler of efficient and inexpensive solar cells, these teachings can also be readily extended to other areas of interest. For example, these teachings can be readily leverages in favor of a new class of biosensors: color sensitive retinal implants. Just as cochlear implants stimulate auditory nerve cells in the cochlea of the ear, so retinal implants stimulate cells in the retina of the eye that connect to the optic nerve. The search for such visual aids has been underway for a long time with the ultimate goal of providing color vision to the visually impaired. The ability to optimize the electrical response to light wavelength by controlling the length of graphene shell/silicon carbide nanowires make these nanostructures uniquely suited to color discriminative retinal implant applications. Furthermore, because these biosensors are photosensors as well as photovoltaics, the incoming light itself can source the energy that powers their operation thus potentially obviating the need for batteries.

It will be appreciated that although the aforementioned first modality of solar energy conversion generates electricity photovoltaically while the second modality of solar energy conversion generates electricity thermally, the first modality will also typically produce heat as a byproduct of photovoltaic conversion. This heat can in fact augment the total electricity generated thermally by the second modality of solar energy conversion.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

I claim:

1. An apparatus comprising a first modality of solar energy conversion that is disposed between a source of light and a second modality of solar energy conversion that comprises a fluid-based modality of solar energy conversion such that both the first modality of solar energy conversion and the second modality of solar energy conversion generate electricity using a same source of light and wherein the fluid of the fluid-based modality of solar energy conversion does not cool the first modality of solar energy conversion.

2. The apparatus of claim 1 wherein the second modality of solar energy conversion converts heat into electricity.

3. The apparatus of claim 2 wherein the second modality of solar energy conversion includes a tower having a plurality of fluid-carrying solar collectors.

4. The apparatus of claim 2 wherein the first modality of solar energy conversion is disposed directly on a heat-absorbing surface that comprises a part of the second modality of solar energy conversion.

5. The apparatus of claim 4 wherein the heat-absorbing surface comprises a fluid-carrying conduit.

6. The apparatus of claim 4 wherein the first modality of solar energy conversion comprises a plurality of layers of graphene sufficient to absorb, in the aggregate, at least substantially all of the light that impinges thereupon.

7. The apparatus of claim 6 wherein the plurality of layers of graphene comprises at least forty layers of graphene.

8. The apparatus of claim 4 wherein the source of light comprises light received directly from a star.

9. The apparatus of claim 8 wherein the source of light comprises both light received directly from the star and light received via at least one reflection of the light from the star.

10. The apparatus of claim 2 wherein the second modality of solar energy conversion includes at least one fluid-carrying solar collector, and wherein the second modality of solar energy conversion further includes at least one thermal storage unit configured to receive heat from the at least one fluid-carrying solar collector such that heat stored in the thermal storage unit can be used to generate electricity in the absence of light from the source of light.

11. The apparatus of claim 10 wherein a liquid contained in the liquid-carrying solar collector has an operating temperature range in excess of 350 degrees Centigrade.

12. The apparatus of claim 1 wherein the first modality of solar energy conversion comprises:

a core consisting essentially of a wide band-gap material, wherein the core has at least one bisectional dimension that does not exceed 100 nanometers;

a shell consisting essentially of graphene conformally disposed about at least a substantial portion of the core.

13. The apparatus of claim 12 wherein the first modality of solar energy conversion comprises a plurality of the cores that each have one of the shells disposed thereabout.

14. The apparatus of claim 13 wherein the plurality of cores are disposed with their longitudinal axes oriented at least substantially parallel to one another.

15. The apparatus of claim 14 wherein the longitudinal axes range from at least about 200 nanometers to no more than about 5000 nanometers.

16. The apparatus of claim 12 wherein at least one of the core and the shell includes a dopant.

17. The apparatus of claim 1 wherein the apparatus further comprises a fluid-bearing conduit that comprises a component of the second modality of solar energy conversion and wherein the first modality of solar energy conversion is disposed on an outer surface of the fluid-bearing conduit.

18. The apparatus of claim 17 wherein the first modality of solar energy conversion is in thermal contact with a heated fluid borne by the fluid-bearing conduit.

* * * * *

UNITED STATES PATENT AND TRADEMARK OFFICE

CERTIFICATE OF CORRECTION

PATENT NO. : 8,829,331 B2
APPLICATION NO. : 13/908215
DATED : September 9, 2014
INVENTOR(S) : Dieter M. Gruen It is certified that error appears in the above-identified patent and that said Letters Patent is hereby corrected as shown below:

Title Page, item (56), OTHER PUBLICATIONS:

Page 2, Column 2, Line 35: Change “5000” to -- 500 --;

Page 2, Column 2, Line 36: Change “Exhibitionn” to -- Exhibition --;

Page 3, Column 1, Line 45: Change “Nanotechnololgy” to -- Nanotechnology --;

Page 3, Column 1, Line 48: Change “Ti02 Nantubes” to -- TiO2 Nanotubes --;

Page 3, Column 2, Line 3: Change “Sco.” to -- Soc. --;

Page 3, Column 2, Line 10: Change “Meoscience” to -- Nanoscience --; and

Page 3, Column 2, Line 47: Change “Heterstructure” to -- Heterostructure --.

Signed and Sealed this
Twenty-fourth Day of February, 2015

Michelle K. Lee
*Deputy Director of the United States Patent and Trademark Office*